United States Patent

(12) United States Patent
Guthrie

(10) Patent No.: US 6,266,244 B1
(45) Date of Patent: Jul. 24, 2001

(54) MOUNTING METHOD AND APPARATUS FOR ELECTRICAL COMPONENTS

(75) Inventor: Brian S. Guthrie, Greenwood, IN (US)

(73) Assignee: Harman International Industries Incorporated, Northridge, CA (US)

( * ) Notice: Subject to any disclaimer, the term of this patent is extended or adjusted under 35 U.S.C. 154(b) by 0 days.

(21) Appl. No.: 09/426,731

(22) Filed: Oct. 25, 1999

(51) Int. Cl.$^7$ ........................................... H05K 7/20
(52) U.S. Cl. .................. 361/704; 361/702; 361/707; 361/710; 257/707; 257/713; 174/16.3; 165/80.3; 24/295; 411/477
(58) Field of Search ...................... 361/702–710, 361/688, 690, 715–722, 807, 809, 811, 727, 712–719, 802, 803, 725–729; 257/713, 715, 718–719, 706–727; 165/80.3, 80.4, 185, 80.2; 174/16.3, 15.1, 15.2, 252; 24/295, 458, 573, 625, 293, 292; 411/477

(56) References Cited

U.S. PATENT DOCUMENTS

| | | |
|---|---|---|
| 4,193,444 | 3/1980 | Boyd et al. . |
| 4,204,248 | 5/1980 | Proffit et al. . |
| 4,288,839 | 9/1981 | Prager et al. . |
| 4,509,839 | 4/1985 | Lavochkin . |
| 4,707,726 | 11/1987 | Tinder . |
| 4,803,545 * | 2/1989 | Birkle ........................... 357/81 |
| 4,872,089 * | 10/1989 | Ocken et al. ................. 361/388 |
| 4,899,255 * | 2/1990 | Case et al. .................... 361/386 |
| 4,972,294 * | 11/1990 | Moses et al. ................. 361/386 |
| 5,060,112 | 10/1991 | Cocconi . |
| 5,068,764 * | 11/1991 | Bland ........................... 361/386 |
| 5,077,638 * | 12/1991 | Andersson et al. ........... 361/388 |
| 5,122,480 | 6/1992 | Galich et al. . |
| 5,274,193 | 12/1993 | Bailey et al. . |
| 5,309,979 | 5/1994 | Brauer . |
| 5,321,582 | 6/1994 | Casperson . |
| 5,327,324 | 7/1994 | Roth . |
| 5,343,362 * | 8/1994 | Solberg ......................... 361/710 |
| 5,363,552 | 11/1994 | Coniff . |
| 5,369,879 | 12/1994 | Goeschel et al. . |
| 5,373,099 * | 12/1994 | Boitard et al. ................ 174/16.3 |
| 5,461,541 * | 10/1995 | Wentland et al. ............. 361/707 |
| 5,466,970 * | 11/1995 | Smithers ....................... 257/712 |
| 5,812,376 | 9/1998 | Mach et al. . |
| 5,834,842 * | 11/1998 | Majumdar et al. ........... 257/718 |
| 5,896,270 * | 8/1999 | Tsui .............................. 361/704 |
| 5,909,358 * | 6/1999 | Bradt ............................ 361/707 |

FOREIGN PATENT DOCUMENTS

| | | | | |
|---|---|---|---|---|
| 004141650A1 | * | 6/1993 | (DE) | H01L/23/32 |
| 000751563A2 | * | 1/1997 | (EP) | H01L/23/40 |
| 362252158A | * | 11/1997 | (JP) | H01I/23/40 |

* cited by examiner

Primary Examiner—Leo P. Picard
Assistant Examiner—Michael Datskovsky
(74) Attorney, Agent, or Firm—Barnes & Thornburg

(57) ABSTRACT

A heat sink is formed from a base component and a clamping component. The base component and clamping component include a locking groove and a tab for insertion into the locking groove. The clamping component includes at least one clamping leg. The base component includes a surface. The clamping leg is designed to snap over the surface to couple the two components together and capture between them in heat conducting relationship with at least one of the components at least one device which evolves heat during its operation.

7 Claims, 2 Drawing Sheets

MOUNTING METHOD AND APPARATUS FOR ELECTRICAL COMPONENTS

FIELD OF THE INVENTION

This invention relates to methods and apparatus for mounting electrical components to structural members. It is disclosed in the context of mounting electrical components which evolve heat during their operation to a heat sink, but is believed to be useful in other applications as well.

BACKGROUND OF THE INVENTION

A number of assemblies and assembly methods have been proposed for mounting electrical components to, for example, the chassis of electrical devices. There are, for example, the devices and methods illustrated and described in U.S. Pat. Nos. 4,193,444; 4,204,248; 4,288,839; 4,509,839; 4,707,726; 5,060,112; 5,122,480; 5,309,979; 5,321,582; 5,327,324; 5,363,552; 5,369,879; and, 5,812,376, to identify but a few. This listing is not intended as a representation that a thorough search of the prior art has been conducted or that no more pertinent art than that listed above exists, and no such representation should be inferred.

Power semiconductive devices, such as bipolar power transistors, typically are mounted on heat sinks which conduct away from the active regions of such devices heat evolved by the active regions of such devices during their operation. Examples include power transistors in the output stages of audio amplifiers operating in classes A and AB. These devices are required to be mounted in such ways as to be capable of dissipating powers of the same order of magnitude as is delivered to the loads, typically the voice coils of loudspeakers, they are driving. These powers must be dissipated in order to prevent damage to the devices themselves. Usually, this is accomplished by mounting such devices on heat sinks, massive structures of highly heat conductive material, for example, aluminum, mounted to, or formed as part of, the chassis of the electrical equipment of which the power semiconductive devices are components.

In the past, threaded fasteners have routinely been used to mount such power semiconductive devices to such heat sinks. This is problematic for a number of reasons, not the least of which is that the headers of such devices, which are, by design, frequently maintained at the same electrical potentials as one of the terminals, for example, the collector, of the devices, are also the components of the devices through which pass the threaded fasteners used to attach the devices to the heat sinks. This requires that some care be exercised in mounting the devices to the heat sinks in ways which will promote the flow of heat from the devices, but maintain electrical insulation of the devices from the heat sinks. Alternatively, the chassis of such electrical equipment must be designed in such a way as to accommodate heat sinks at the electrical potential of one of the terminals of the electrical devices mounted on them. This, in turn, may require multiple heat sinks, each electrically insulated not only from other heat sinks on the same electrical equipment but also typically from the chassis of the electrical equipment itself.

DISCLOSURE OF THE INVENTION

According to one aspect of the invention, a heat sink is formed from first and second components including first and second engagement means, respectively. The first engagement means is designed for receiving the second engagement means. One of the components includes at least one clamping leg. The other of the components includes a surface. The clamping leg is designed to snap over the surface to couple the two components together and capture between the first and second components in heat conducting relationship with at least one of the first and second components at least one device which evolves heat during its operation.

Illustratively according to this aspect of the invention, the first and second components include a base component and a clamping component.

Additionally illustratively according to this aspect of the invention, the first engagement means includes a groove provided in the base component.

Further illustratively according to this aspect of the invention, the clamping legs are formed on the clamping component.

Illustratively according to this aspect of the invention, means are provided for at least partially electrically insulating the one or more devices from the first and second components.

According to another aspect of the invention, a method of dissipating heat evolved by an electrical device includes capturing the device between first and second components in heat conducting relationship with at least one of the first and second components. The first and second components are provided with first and second engagement means, respectively. The first engagement means receives the second engagement means. At least one clamping leg is provided on one of the components. A surface for engagement by the clamping leg to couple the two components together is provided on the other of the components.

Illustratively according to this aspect of the invention, providing the first and second components includes providing a base component and a clamping component.

Further illustratively according to this aspect of the invention, providing the first engagement means includes providing a groove.

Additionally illustratively according to this aspect of the invention, providing the groove includes providing the groove in the base component.

Illustratively according to this aspect of the invention, providing the second engagement means includes providing a clamping component.

Further illustratively according to this aspect of the invention, providing the clamping leg includes providing the clamping leg on the clamping component.

Additionally illustratively according to the present invention, providing the second engagement means includes providing a tab on the clamping component.

Illustratively according to this aspect of the invention, the method further includes at least partially electrically insulating the device from the first and second components.

BRIEF DESCRIPTION OF THE DRAWINGS

The invention may best be understood by referring to the following detailed descriptions of illustrative embodiments and accompanying drawings which illustrate the invention. In the drawings.

DETAILED DESCRIPTIONS OF ILLUSTRATIVE EMBODIMENTS

Figure 1:
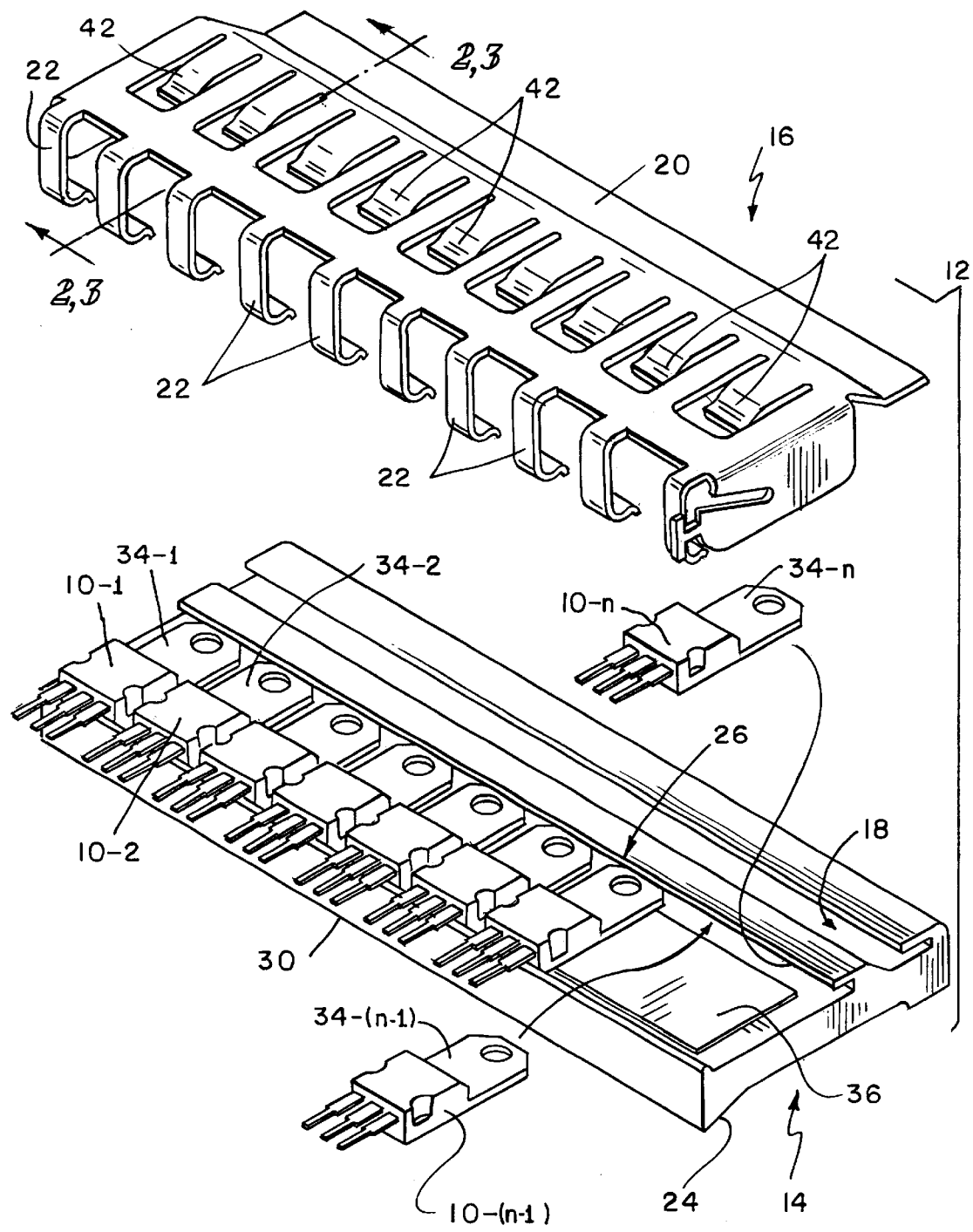
FIG. 1 illustrates an exploded perspective view of a system constructed according to the present invention.
Figure 2:
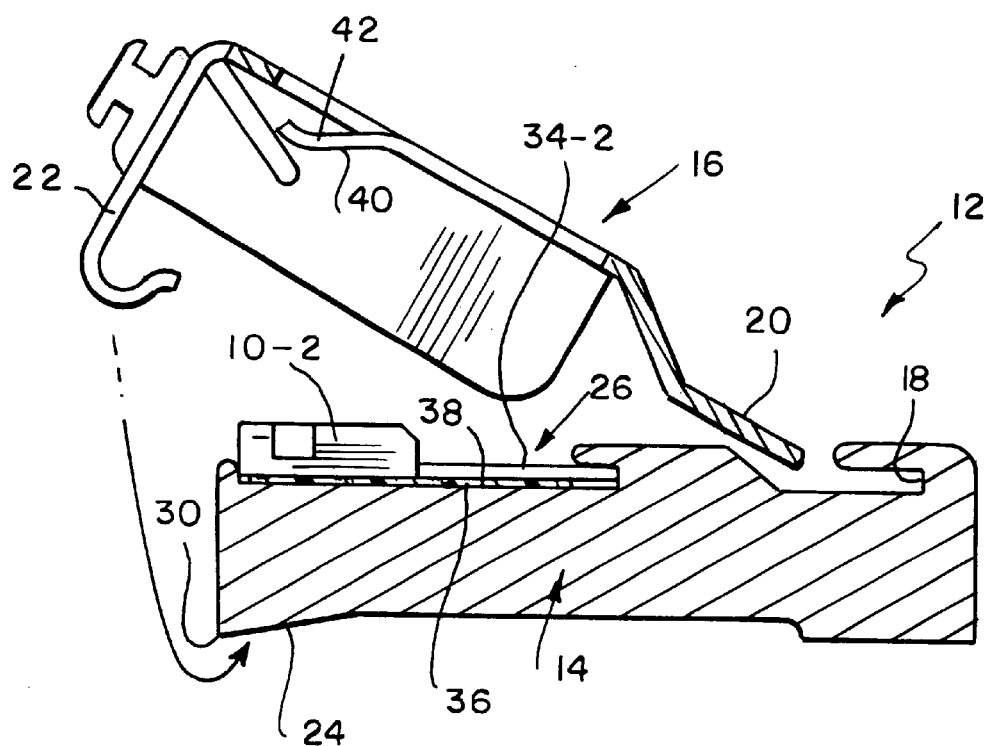
FIG. 2 illustrates a fragmentary sectional view, taken generally along section lines 2,3—2,3, of the system illustrated in FIG. 1 in one stage of assembly; and, FIG. 3 illustrates a fragmentary sectional view, taken generally along section lines 2,3—2,3, of the system illustrated in FIGS. 1–2 in a subsequent stage of assembly.
Figure 3:
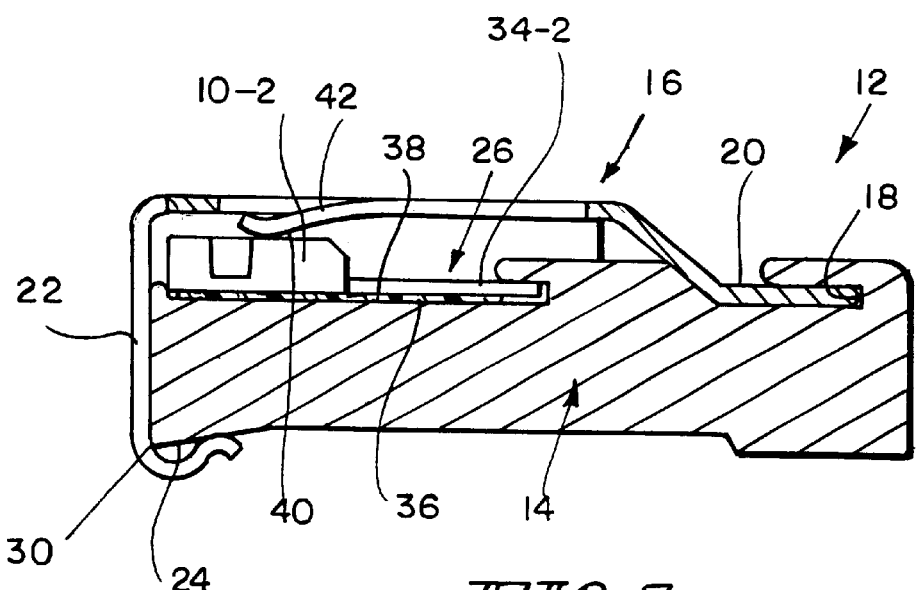

Turning now to the drawings, the use of multiple semiconductor devices 10-1, . . . 10-n in line in close proximity to each other is a standard practice in, for example, the audio industry. Many such applications require the semiconductor devices 10-1, . . . 10-n to be mounted to heat sinks to dissipate heat evolved during operation of the devices ;110-1, . . . 10-n. According to the invention, a heat sink 12 is formed from two components, a first, base component 14, and a second, clamping component 16. One, 14, of the components includes a groove 18 into which a tab 20 on the other, 16, of the components is inserted. One, 16, of the components also includes one or more clamping legs 22 which snap over a surface 24 of the other, 14, of the components to couple the two components 14, 16 together and capture between them in heat conducting relationship with the heat sink 12 the devices 10-1, . . . 10-n which evolve heat during their operation.

The first, 14, of the components illustratively is an aluminum extrusion which is formed to provide a locking groove 18 adjacent a region 26 thereof in which a number of heat evolving devices 10-1, . . . 10-n, illustratively power transistors in so-called TO 220 device packages, are to be mounted. The other, 16, of the components is a clamping component, illustratively a thin, resilient stamped steel, with a tab 20 which is insertable into the locking groove 18. On downward rotation of the clamping component 16, clamping legs 22 provided adjacent the locations at which the devices 10-1, . . . 10-n are to be located, pass over an edge 30 of the first component 14 and snap into engagement with the back surface 24 of the first component 14, capturing the devices 10-1, . . . 10-n between the two components 14, 16 in heat conducting relationship with them.

In circumstances where it is desirable to maintain the headers 34-1, . . . 34-n of the devices 10-1, . . . 10-n electrically isolated from each other and/or the components 14, 16, heat conductive, electrically insulative material 36, such as mica insulative strips, electrically insulative tape, thermal joint compound, and so on, can be applied to one or the other or both, as necessary, of the facing surfaces 38, 40 of components 14, 16. Of course, in the illustrated embodiment, because the devices 10-1, . . . 10-n are in TO 220 packages, component 16 clamps against the epoxy packages of devices 10-1, . . . 10-n, and so, no electrically insulative material 36 is required between devices 10-1, . . . 10-n and surfaces 40, since the epoxy is itself a sufficient electrical insulator.

Among advantages of the illustrated heat sinking system and method are that no other mechanical fasteners are required for assembly of the heat sink 12 with devices 10 in it. The assembly process is a quick, simple, snap together process, In applications where relatively higher pressure is applied to heat evolving devices 10, stress is reduces as normal forces are transferred through clamping tabs 42 provided on component 16 to engage each device 10-1, . . . 10-n. Clearly, this construction can be used for virtually any number of devices 10-1, . . . 10-n. During assembly, component 16 must be compressed past the clamped orientation because of the design of clamping legs 22. This increases the likelihood of achieving good thermal contact between the devices 10-1, . . . 10-n and the components 14, 16 through the electrically insulative material 36.

What is claimed is:

1. A heat sink comprising a base component including first and second spaced apart, generally oppositely facing major surfaces, a clamping component including a clamping leg for engaging the second major surface, a first tab, and a second tab, the first major surface including a first groove and a second groove, the first tab engaging the first groove in the assembled heat sink, the second groove configured to receive a device which evolves heat during its operation, the clamping leg engaging the second major surface, and the second tab configured to engage the device to press the device toward the base component to clamp the device to the first major surface a heat conducting relationship between the device and at least one of the base component and the clamping component.

2. The heat sink of claim 1 wherein the second groove is spaced apart from the clamping leg and the first tab.

3. The heat sink of claim 2 wherein the base component includes first and second spaced apart side surfaces extending between the first and second major surfaces, and the first second grooves are both spaced apart from both the first and second side surfaces.

4. The heat sink of claim 3 wherein the second groove is between the clamping leg and the first groove in the assembled heat sink.

5. The heat sink of claim 1 wherein the base component includes first and second spaced apart side surfaces extending between the first and second major surfaces, and the first and second grooves are both spaced apart from both the first and second side surfaces.

6. The heat sink of claim 5 wherein the second groove is between the clamping leg and the first groove in the assembled heat sink.

7. The heat sink of claim 1 wherein the second groove is between the clamping leg and the first groove in the assembled heat sink.

* * * * *